(12) United States Patent
Verhees

(10) Patent No.: US 6,384,547 B2
(45) Date of Patent: May 7, 2002

(54) LINE DEFLECTION CIRCUIT

(75) Inventor: Johannes Ludovicus Maria Verhees, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/759,024

(22) Filed: Jan. 11, 2001

(30) Foreign Application Priority Data

Jan. 13, 2000 (EP) ............................................. 00200093

(51) Int. Cl.[7] ................................................. H01J 29/56
(52) U.S. Cl. ........................................ 315/387; 315/387
(58) Field of Search ................................. 315/364, 387, 315/388, 389, 371

(56) References Cited

U.S. PATENT DOCUMENTS 4,634,938 A * 1/1987 Haferl ........................ 315/371

* cited by examiner

*Primary Examiner*—David Vu
(74) *Attorney, Agent, or Firm*—Steven R. Biren

(57) ABSTRACT

An electronic circuit for switching an inductive load (10) by way of a bipolar transistor (1) whereby a switching signal is supplied to the base (5) of a switching transistor (1) via an LRC circuit (6, 7, 9). During switching off the LRC circuit (6, 7, 9) causes a peak voltage at the base (5) of the switching transistor (1). The value of the peak voltage is a maximum when the power dissipation of the switching transistor (1) is a minimum. A regulator circuit (12–17) regulates a current source (18) in a primary winding of a switched transformer (22) in such a way that the peak voltage (Vp) is maximized.

8 Claims, 3 Drawing Sheets

LINE DEFLECTION CIRCUIT

BACKGROUND OF THE INVENTION

The invention relates to a line deflection circuit comprising a switching transistor, a collector of said switching transistor being connected to a supply voltage via at least a primary winding of a transformer, said transformer having a secondary winding which is provided with a first and with a second secondary connection, which first secondary connection is connected to a base of a second switching transistor in a grounded emitter circuit.

Such line deflection circuits are known. When the line deflection circuit is in operation, major currents flow through the second switching transistor. These major currents are to be switched off at regular intervals, i.e. at each line which is written on a picture screen. Switching off of the major current through the second switching transistor takes place in that the voltage at the base of the second switching transistor is made zero or even negative, and the current entering the base is made equal to zero. If the current entering the base of the transistor is greater than what corresponds to the hfe of the relevant switching transistor while a major current is being passed, it will cost more time than is absolutely necessary to reduce the base current to zero on account of the large quantity of charge carriers present in the base. On the other hand, if the current passed into the base is too small, the collector-emitter voltage remaining across the second switching transistor remains so great that, in conjunction with the high value of the current, a considerable amount of heat is dissipated in the second switching transistor, so that the latter is liable to heat up quickly and may become defective.

The use of bipolar transistors for switching inductive loads, such as a line deflection coil in a TV set or monitor, has the advantage that these bipolar transistors can withstand high collector-emitter voltages but can also carry strong currents without extreme losses and at a low manufacturing cost. A disadvantage of this type of bipolar transistors, however, is the low hfe value, as well as the tolerances on the hfe. As was described above, switching off of such a bipolar transistor requires particular attention.

The above means for appliances which are to be manufactured in series production, such as a TV set or a monitor, that a solution is to be found which takes into account all tolerances which may occur in a line deflection circuit. Such tolerances are found in the hfe, in the values of the components in the control circuit for the base current, in the temperature dependence of said components, and in the frequency dependence of said components. The result of all these tolerances is that in general a design for a line deflection circuit results in a circuit which ensures an optimum switching of the second switching transistor (i.e. with minimum dissipation) in a small proportion of any production series only, whereas in all other units of this same production series the second switching transistor has to dissipate too much heat, either because of conduction losses in the case of underloading or because of switching losses in the case of overloading. This shortens the useful life of the second switching transistor and detracts from the reliability of the line deflection circuit.

SUMMARY

It is an object of the invention to provide a line deflection circuit in which the losses of the second switching transistor, both conduction and switching losses, are kept as low as possible.

According to the invention, this object is achieved in that an inductive reactance is present between the first secondary connection and the base of the second switching transistor, in that a resistor and a DC voltage decoupling capacitor are provided in series between on the one hand a first junction point of the inductive reactance and the base of the second switching transistor and on the other hand a second junction point of the emitter of the second switching transistor and the second secondary connection, in that an input of a peak voltage detection device is connected to the first junction point, in that an input of a control circuit is connected to an output of the peak voltage detection device, in that an output of the control circuit is connected to a voltage-controlled current source, and in that the voltage-controlled current source is connected in series with the primary winding of the transformer between the collector of the first switching transistor and the supply voltage.

It is achieved thereby that, the moment the second switching transistor is switched off, a maximum negative current will flow in the base which rises very quickly to zero and which sees as its load an LCR circuit comprising the inductive reactance, the resistor, and the parasitic capacitance between the base and the emitter of the second switching transistor. The very quick rise to zero of the negative current will generate a peak voltage as a result of the presence of the LCR circuit, the amplitude of said voltage being dependent on the steepness of the positive flank of the current in the base of the second switching transistor. The steeper said positive flank, the higher the peak voltage. The value of the peak voltage is detected by the peak voltage detection device and is used as an input signal for the control circuit. The control circuit controls the voltage-controlled current source on the basis of the value of the peak voltage such that the peak voltage, which is dependent inter alia on the value of the current passed by the current source through the primary winding of the transformer, increases or does not decrease. The value of the peak voltage is a maximum in the situation in which the second switching transistor is optimally adjusted and operates with minimum dissipation.

A preferred embodiment of the invention is characterized in that the control circuit comprises a programmed programmable device.

A further preferred embodiment of the invention is characterized in that the programmed programmable device is programmed so as to change the current through the voltage-controlled current source in steps each time and to detect upon each stepwise change of the current in a first direction in which direction a peak value of the voltage at the first junction point detected by the peak voltage detection device changes as a result of said stepwise change of the current, and so as to effect a further stepwise change in the current through the voltage-controlled current source in the first direction or in an opposite direction in dependence on the detected direction of the change in the peak value.

It is achieved thereby that the control circuit ensures a minimum level of the dissipation of the second switching transistor both in the case of underloading of the second switching transistor (increased dissipation during conduction) and in the case of overloading of the second switching transistor (high dissipation peak during switching off).

BRIEF DESCRIPTION OF THE DRAWINGS

The invention will now be explained in more detail with reference to the accompanying drawings, in which.

DETAILED DESCRIPTION OF THE PREFERRED EMBODIMENTS

Figure 1:
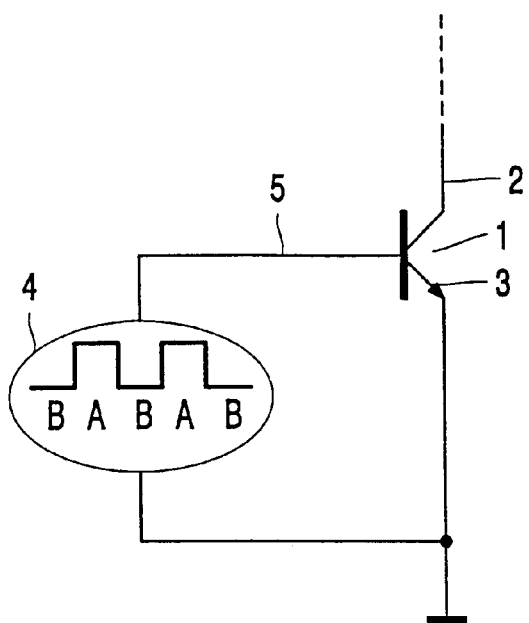
FIG. 1 diagrammatically shows a switching transistor with its control.

FIG. 1 shows a second switching transistor 1 whose collector 2 is capable of carrying a current which flows, for example, through a line deflection coil. An emitter 3 of the second switching transistor 1 is connected to ground. A signal generator 4 generates pulses which fully control the second switching transistor 1 during the time period A so as to be able to pass the maximum current which is necessary for the line deflection coil, whereas during the time period B the second switching transistor 1 is to be switched off completely, and no current flows from the collector to the emitter.

The operation of the circuit shown in FIG. 1 is as follows. During a time period A, a current flows from the generator 4 through the inductive reactance 6 and the base 5 into the second switching transistor 1. In dependence on the hfe value of the second switching transistor 1, a current will flow through the second switching transistor 1 from the collector 2 to the emitter 3 whose value is equal to hfe×the value of the current introduced by the generator 4 into the base 5, provided the second switching transistor 1 is not fully in the saturated state. The voltage at the collector 2 of the second switching transistor 1 accompanying this current is substantially equal to the emitter voltage. In spite of the strong current, the dissipation in the second switching transistor 1 will be very small because the collector-emitter voltage is substantially zero. Underloading of the second switching transistor 1 occurs if the current introduced into the base 5 by the generator 4 is too small for making the current through the collector 2 to the emitter 3 so strong that the collector-emitter voltage is substantially zero. Even a small collector-emitter voltage across the second switching transistor 1 will lead to a considerable amount of dissipated power and a quick rise in temperature of the second switching transistor 1, given the strong current flowing through the collector 2 to the emitter 3.

On the other hand, overloading of the second switching transistor 1 means that the current introduced into the base 5 by the generator 4 is greater than what is necessary for controlling the maximum current which the second switching transistor is capable of carrying from the collector 2 to the emitter 3 by means of the factor hfe. The current entering the base 5 must drop to zero at the transition moment from period A to period B. The drop to zero of the voltage supplied to the base 5 may result in the current in the base 5 changing its direction, i.e. flowing from the base 5. The number of charge carriers in the base 5 of the second switching transistor 1 will decrease at an accelerated rate as a result. The current in the base 5 will finally become zero. Because there was an overload situation, however, a large number of charge carriers was present in the base of the second switching transistor 1. The decrease in the number of charge carriers in the base 5 causes a decrease in the current from the collector 2 to the emitter 3 of the second switching transistor 1. The elements of the line deflection circuit 10, 11 then cause a rise in the collector-emitter voltage of the second switching transistor 1. While the collector-emitter voltage of the second switching transistor 1 is rising and the current from the collector 2 to the emitter 3 of the second switching transistor 1 is decreasing, a power peak will arise which is dissipated in the second switching transistor 1.

As described above, a considerable heat dissipation will take place in the second switching transistor 1 both in the case of an overload and in the case of an underload of the second switching transistor 1.

Figure 2:
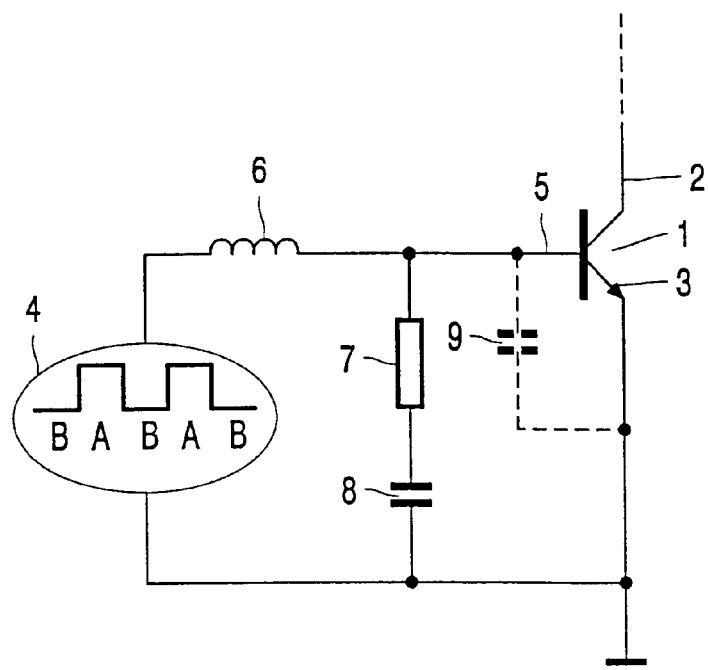
FIG. 2 diagrammatically shows the basic principle of the present invention.
Figure 3:
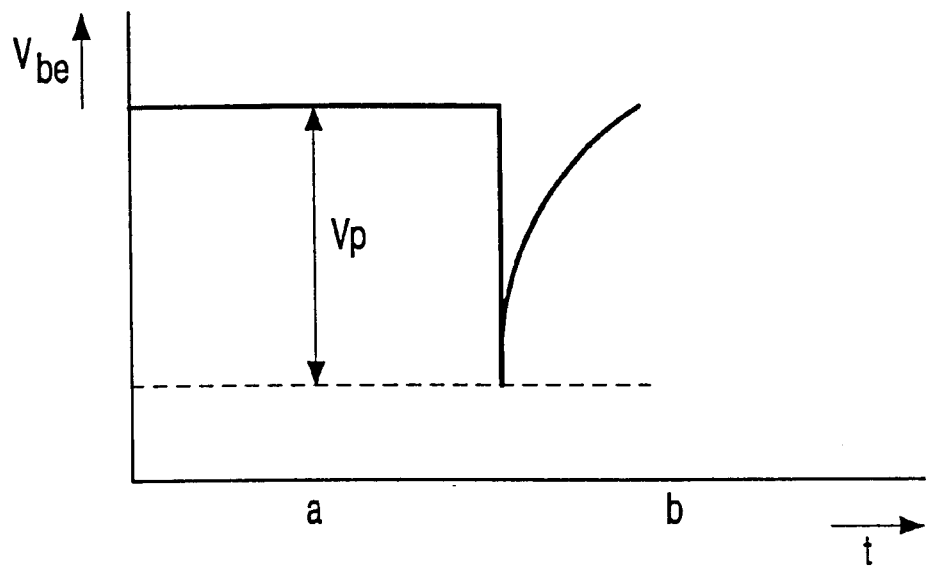
FIG. 3 plots the voltage at the first junction point during switching off of the second switching transistor.

FIG. 2 shows the instruments necessary for generating a signal which can be used to ensure that the circuit is given an optimum adjustment as quickly as possible, in which the dissipation of the second switching transistor is a minimum, both in the case of an overload and in the case of an underload of the second switching transistor 1. The circuit shown in FIG. 2 for this purpose comprises an inductive reactance 6 between an output of the generator 4 and the base 5. Furthermore, a series arrangement of a resistor 7 and a capacitor 8 is provided between on the one hand a first junction point of the inductive reactance 6 and the base 5 of the second switching transistor and on the other hand a second junction point of the emitter 3 of the second switching transistor and a second connection of the generator 4. FIG. 2 also shows with a broken line a capacitor 9, which represents the parasitic capacitance between the base 5 and the emitter 3 of the second switching transistor 1. A negative current flows in the base 5, which current will rise very quickly to zero, at the transition moment from time period A to time period B, when the current from the collector 2 to the emitter 3 of the second switching transistor 1 is to be switched off. This strongly rising current form sees an LCR circuit as its load. The LCR circuit comprises the inductive reactance 6, the resistor 7, and the parasitic capacitance 9. It should be noted that the capacitor 8 serves only to decouple the resistor 7 from the rest of the circuit with respect to DC voltage. The current in the base 5 which rises quickly to zero generates a peak voltage Vp as shown in FIG. 3 across the inductive reactance 6, the resistor 7, and the capacitor 9. The value of this peak voltage is dependent on the rate at which the current in the base 5 rises to zero and also on the value of this current at the moment it started rising to zero. Vp will accordingly be greater in proportion as the base current is stronger in the underload region and in proportion as the degree of overloading is smaller in the overload region. Vp will thus be a maximum if there is neither an overload nor an underload situation.

Figure 4:
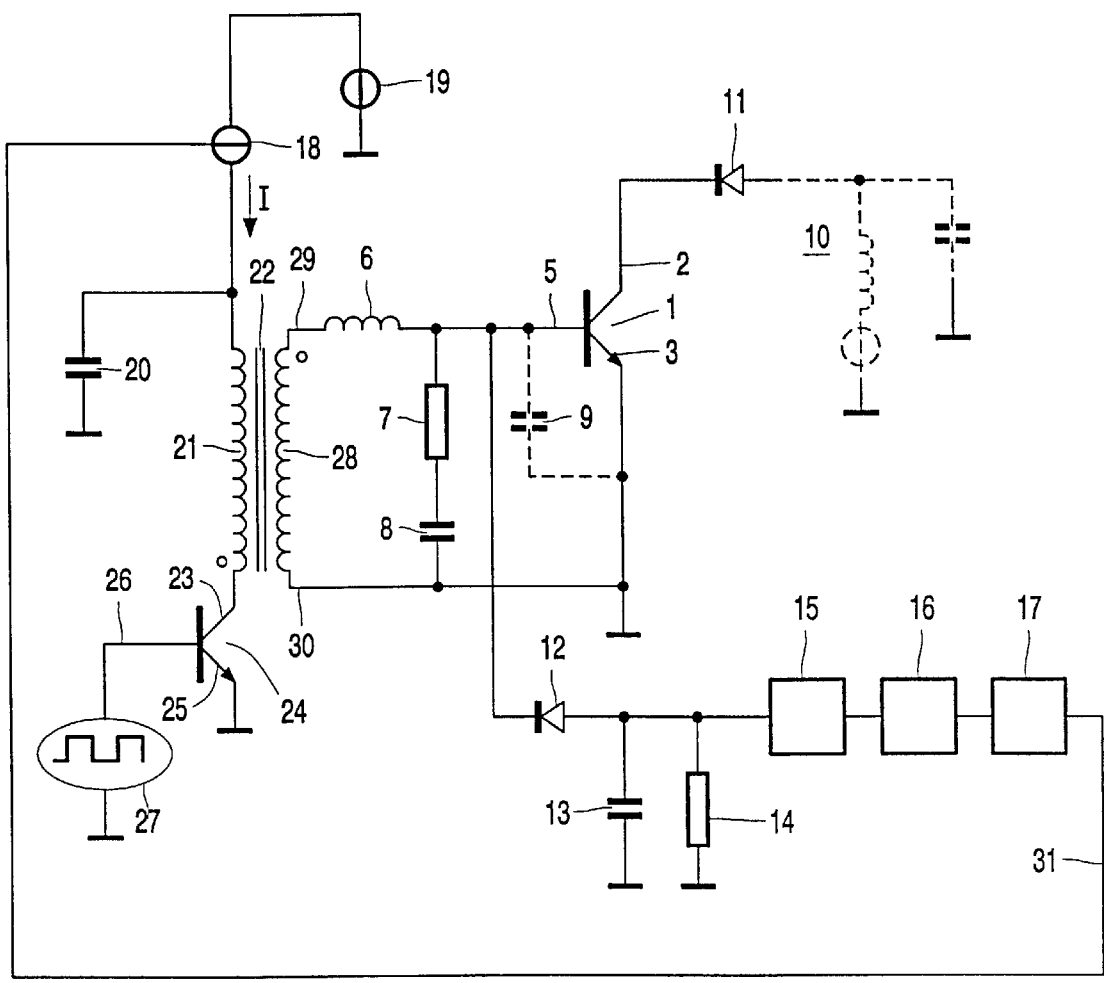
FIG. 4 is an example of a line deflection circuit according to the invention.

FIG. 4 shows a line deflection circuit which utilizes the circuit elements shown in FIG. 2 for controlling the current in the base 5 of the switching transistor 1 such that there will be neither an overload nor an underload.

Elements in FIG. 4 corresponding to elements shown in FIG. 2 have been given the same reference numerals. In FIG. 4, the load of the collector 2 of the second switching transistor 1 comprises a diode 11 as well as a line deflection coil, a flyback capacitor, and the accompanying supply source, diagrammatically indicated with joint reference numeral 10. The elements 10 and 11 have been indicated merely for the sake of completeness and general understanding, but their specific embodiments do not play a part in the present invention.

A diode 12 is connected by its cathode to the first junction point. The anode of the diode 12 is connected to a first side of a capacitor 13 and to a first side of a resistor 14. The second side of the capacitor 13 and the second side of the resistor 14 are connected to ground. The anode of the diode 12 is connected to an input of an analog-digital converter 15. An output of the analog-digital converter 15 is connected to an input of a programmable device 16. An output of the programmable device 16 is connected to an input of a digital-analog converter 17. An output of the digital-analog converter 17 is connected to a control input of a current source 18. The current source 18 is connected at one side by a current input to a supply voltage 19 and on another side by a current output to a first side of a capacitor 20 whose other side is connected to ground. The current source 18 is also connected by its current output to a first side of a primary winding 21 of a transformer 22. A second side of the primary winding 21 is connected to a collector 23 of a first switching transistor 24 whose emitter 25 is grounded. A base 26 of the first switching transistor 24 is connected to an output of a signal generator 27 for the generation of a square-wave voltage. A secondary winding 28 of the transformer 22 has a first secondary connection 29 and a second secondary connection 30. The first secondary connection 29 is connected to the inductive reactance 6, and the second secondary connection 30 is connected to the emitter 3 of the second switching transistor 1.

The operation of the line deflection circuit shown in FIG. 4 is as follows. The current source 18 passes a current I into the capacitor 20 and through the primary winding 21 of the transformer 22. The current through the primary winding 21 of the transformer 22 is switched by means of the first switching transistor 24 in a rhythm imposed by the signal generator 27. This results in the creation of pulsatory signals between the first and the second secondary connection 29 and 30 of the secondary winding 28 of the transformer 22. During a time period A (see FIG. 1 and FIG. 2), the resistor 7 is ineffective as a result of the presence of the capacitor 8. A major current flows from the collector 2 to the emitter 3 of the second switching transistor 1 during the time period A, and the collector-emitter voltage of the second switching transistor 1 is substantially zero. Subsequently a voltage and current situation arises between the first secondary connection 29 and the second secondary connection 30 of the secondary winding 28 as a result of which the input current of the base 5 of the second switching transistor 1 starts rising from strongly negative to zero, the current between the collector 2 and the emitter 3 goes to zero, and the collector-emitter voltage between the collector 2 and the emitter 3 starts rising. As was described with reference to FIGS. 2 and 3, the presence of the inductive reactance 6, the resistor 7, and the parasitic capacitance 9 has the result that a negative voltage peak with a value Vp (see FIG. 3) arises at the first junction point. This negative voltage peak is passed on through the diode 12 to the capacitor 13 and the resistor 14. The value of the resistor 14 is chosen such that the voltage Vp across the capacitor 13 does not change substantially during the time required by the analog-digital converter 15 for digitizing the value of Vp.

Figure 5:
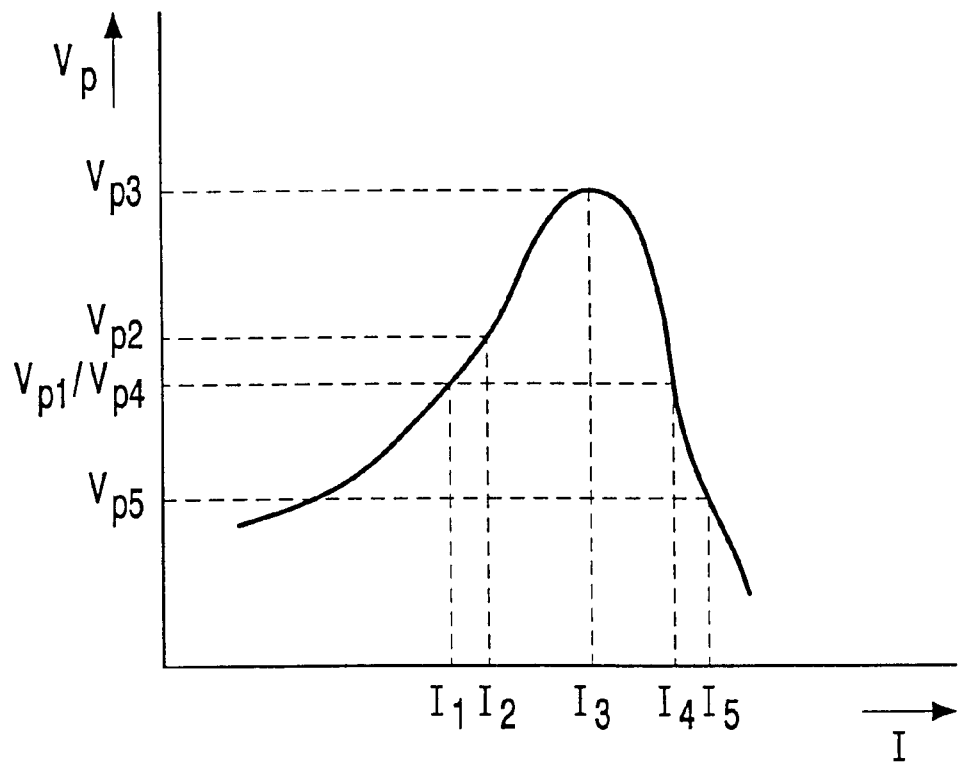
FIG. 5 illustrates how the control circuit performs a control action towards the optimum each time.

It is assumed for the following description that the value of Vp is equal to Vp1 and Vp4 (see FIG. 5). The digitized value of Vp1/Vp4 is subsequently used as an input signal for the programmed programmable device 16. The implementation of the program by the programmable device 16 gives rise to an output signal in digital form which is supplied to an input of a digital-analog converter 17. The digital-analog converter 17 converts the digital output signal of the programmed programmable device 16 into a voltage on line 31. The line 31 is connected to a control input of a voltage-controlled current source 18. The current I supplied by the current source 18 is now set for the value which corresponds to the voltage on the line 31.

The value of the current I determines inter alia the value of the voltage peak Vp (see FIG. 3). It is assumed in the above description that the value of Vp corresponds to Vp1/Vp4 (see FIG. 5). It is obvious that Vp1/Vp4 is not the maximum value which Vp is capable of achieving. It will be assumed in the following text that the above description related to a situation which started when the current I was equal to I1, without this limiting the general nature of the above description. This means that the voltage peak Vp which is passed on through the diode 12 to the capacitor 13 and the analog-digital converter 15 and the programmed programmable device 16 is smaller than the maximum value Vp3 which the voltage peak Vp is capable of achieving. The programmable device 16 is now programmed such that, after reception at the input of the digital signal representing the voltage Vp1/Vp4, a signal in digital form appears at the output of the programmable device 16, which signal ensures, after being converted into an analog voltage on line 31 by the digital-analog converter 17, that the current source 18 switches to a higher current I2. As a result of this higher current I2, a subsequent voltage peak at the first junction point will lead to a peak voltage Vp2 as shown in FIG. 5. The voltage Vp2 is also below the maximum achievable peak voltage Vp3. The peak voltage Vp2 again arrives in digitized form at the input of the programmed programmable device 16. The previous value of the peak voltage, Vp1/Vp4, was stored in the programmed programmable device 16 so as to be compared with the new peak voltage Vp2. It is concluded from a comparison of the peak voltage Vp1/Vp4 with Vp2 that the peak voltage Vp2 is greater than the peak voltage Vp1, and that accordingly there is a movement in the direction of the maximum peak voltage Vp3 caused by the increase in the current I supplied by the current source 18. The programmed programmable device 16 concludes from the fact that Vp2 is greater than Vp1 that a further increase in the current I is necessary in response to the reception of the digitized value Vp2 so as to come closer to the maximum Vp3. Therefore, the output signal of the programmed programmable device 16 responds to the reception of the peak voltage Vp2 by causing a voltage on line 31 which triggers the voltage-controlled current source 18 into supplying a current which is again one step greater than I2. The above process continues until in steps the current I3 has been achieved which corresponds to the maximum voltage Vp3.

It was assumed in the above that the voltage Vp1/Vp4 resulted from the presence of a current I1 supplied by the voltage-controlled current source 18. Assuming that the voltage Vp1/Vp4 is present at the capacitor 13, it will now be discussed what the consequences will be if at that moment the current I supplied by the voltage-controlled current source 18 is equal to I4. Again, the voltage Vp1/Vp4 becomes available in digitized form at the input of the programmed programmable device 16. Since there is not yet a history of previous voltages which could have been stored in the programmed programmable device 16, the first reaction generated by the programmed programmable device 16 is an output signal which leads to an increase in the current I supplied by the voltage-controlled current source 18, i.e. a stepwise increase from I4 to I5. The result of the increase of the current from I4 to I5 is that the peak voltage at the first junction point drops from a voltage Vp1/Vp4 to Vp5. This drop, which is introduced into the programmed programmable device 16 via the diode 12, the capacitor 13, the analog-digital converter 15, and the input of the device 16, leads to a recognition that an increase in the current I will result in a decrease in the peak voltage Vp. This corresponds to a move further away from the maximum voltage Vp3, as is visible in FIG. 5. The availability in the programmed programmable device 16 of both the voltage Vp4 and the voltage Vp5, corresponding to the currents I4 and I5, respectively, leads to the conclusion that the current I is to be reduced in order to come closer to the peak voltage Vp3. In response to the fact that Vp5 is smaller than Vp4, a digital signal will appear at the output of the programmed programmable device 16 which, after conversion in the digital-analog converter 17, will give rise to a voltage on the line 31 which will trigger the voltage-controlled current source 18 into reducing the current I by one step from I5 to I4. Then a fresh digitized peak voltage Vp4 will be offered to the input of the programmed programmable device 16. Since the previous peak voltage Vp5 stored in the memory of the device 16 is smaller than the new peak voltage Vp4, while also the new current I4 is smaller than the previous current I5, the programmed programmable device 16 is aware that a reduction of the current will lead to a further approximation of the maximum peak voltage Vp3. The result of this is that the new output signal at the output of the programmed programmable device 16 will have the effect that a voltage appears on line 31 which will trigger the voltage-controlled current source 18 into generating a current I which is smaller than the current I4 by one step. In a similar manner as described above with reference to the current I2, the current I3 will now be approached in steps until the peak voltage Vp has become equal to the maximum peak voltage Vp3 which is achievable.

It should be noted that the absolute value of the peak voltage Vp3 is not known per se, and need not be known, because a continuation of steps will lead to a switchover from the one flank in FIG. 5 to the other flank in FIG. 5, with the accompanying inversion of the increase and decrease, respectively, of the current I.

The above description may be supplemented with an additional property of the program carried out by the programmable device 16, i.e. that the step size of the current I may be dependent on the step size of the voltage Vp, such as Vp2-Vp1 and Vp5-Vp4, which is accompanied by a step size of the current, such as I2-I1 and I5-I4, respectively. If the step size of the current is chosen to be proportional to the step size of the voltage preceding it, the risk that the control mechanism overshoots the peak Vp3 in the case of a current I3 is reduced.

The inductive reactance 6 is indicated as a separate element in the above description. It was found in practice, however, that the leakage inductance of the transformer 22 may suffice as the inductive reactance 6.

The control circuit described above has the advantage that the operating temperature of the second switching transistor will be controlled down to a minimum independently of its typical characteristics, thus enhancing operational reliability. Time-consuming investigations for getting acquainted with all the consequences of tolerances can be omitted. If the control range of the loop formed by the transformer 22, the inductive reactance 6, the resistor 7, the capacitor 9, the peak detection circuit comprising the elements 12, 13, and 14, and the control circuit comprising the elements 15, 16, and 17 and the current source 18 is chosen to be sufficiently great, major variations in the peak current of the collector 2 (for example resulting from a variation in the picture width of a TV set), variations in hfe, and variations in frequency can be well compensated such that the dissipated power in the switching transistor 1 is always controlled down to the lowest possible value.

The present invention was described with reference to a line deflection circuit, but it may equally well be applied to other circuits where inductive loads are to be switched, such as switch mode power supplies, lamp ballasts, and motor controls.

What is claimed is:

1. A line deflection circuit comprising a first switching transistor (24), a collector (23) of said first switching transistor (24) being connected to a supply voltage (19) via at least a primary winding (21) of a transformer (22), said transformer (22) having a secondary winding (28) which is provided with a first (29) and with a second (30) secondary connection, which first secondary connection (29) is connected to a base (5) of a second switching transistor (1) in a grounded emitter circuit, characterized in that an inductive reactance (6) is present between the first secondary connection (29) and the base (5) of the second switching transistor (1), in that a resistor (7) and a DC voltage decoupling capacitor (8) are provided in series between on the one hand a first junction point of the inductive reactance (6) and the base (5) of the second switching transistor (1) and on the other hand a second junction point of the emitter (3) of the second switching transistor (1) and the second secondary connection (30), in that an input of a peak voltage detection device (12, 13, 14) is connected to the first junction point, in that an input of a control circuit (15, 16, 17) is connected to an output of the peak voltage detection device (12, 13, 14), in that an output of the control circuit (15, 16, 17) is connected to a voltage-controlled current source (18), and in that the voltage-controlled current source (18) is connected in series with the primary winding (21) of the transformer (22) between the collector (23) of the first switching transistor (24) and the supply voltage (19).

2. A line deflection circuit as claimed in claim 1, characterized in that the control circuit (15, 16, 17) comprises a programmed programmable device (16).

3. A line deflection circuit as claimed in claim 2, characterized in that an analog-digital converter (15) is connected between the peak voltage detection device (12, 13, 14) and the programmed programmable device (16).

4. A line deflection circuit as claimed in claim 3, characterized in that a digital-analog converter (17) is provided between the programmed programmable device (16) and the voltage-controlled current source (18).

5. A line deflection circuit as claimed in any one of the claims 1 to 4, characterized in that the programmed programmable device (16) is programmed so as to change the current (I) through the voltage-controlled current source (18) in steps each time and to detect upon each stepwise change of the current (I) in a first direction in which direction a peak value (Vp) of the voltage at the first junction point detected by the peak voltage detection device (12, 13, 14) changes as a result of said stepwise change of the current (I), and so as to effect a further stepwise change in the current (I) through the voltage-controlled current source (18) in the first direction or in an opposite direction in dependence on the detected direction of the change in the peak value (Vp).

6. A line deflection circuit as claimed in claim 5, characterized in that the size of the change in the current (I) to be carried out in the first direction or in the opposite direction is dependent on the size of the change in the peak value (Vp).

7. A line deflection circuit as claimed in claim 6, characterized in that the size of the change in the current (I) to be carried out is proportional to the size of the change in the peak value (Vp).

8. A circuit for switching inductive loads (10) comprising a first switching transistor (24), a collector (23) of said first switching transistor (24) being connected to a supply voltage

(19) via at least a primary winding (21) of a transformer (22), said transformer (22) having a secondary winding (28) which is provided with a first (29) and with a second (30) secondary connection, which first secondary connection (29) is connected to a base (5) of a second switching transistor (1) in a grounded emitter circuit, characterized in that an inductive reactance (6) is present between the first secondary connection (29) and the base (5) of the second switching transistor (1), in that a resistor (7) and a DC voltage decoupling capacitor (8) are provided in series between on the one hand a first junction point of the first inductive reactance (6) and the base (5) of the second switching transistor (1) and on the other hand a second junction point of the emitter (3) of the second switching transistor (1) and the second secondary connection (30), in that an input of a peak voltage detection device (12, 13, 14) is connected to the first junction point, in that an input of a control circuit (15, 16, 17) is connected to an output of the peak voltage detection device (12, 13, 14), in that an output of the control circuit (15, 16, 17) is connected to a voltage-controlled current source (18), and in that the voltage-controlled current source (18) is connected in series with the primary winding (21) of the transformer (22) between the collector (23) of the first switching transistor (24) and the supply voltage (19).

* * * * *